United States Patent [19]

Imura et al.

[11] Patent Number: 4,766,009
[45] Date of Patent: Aug. 23, 1988

[54] SELECTIVE WORKING METHOD

[75] Inventors: Midori Imura, Tokyo; Makoto Morijiri, Hitachi; Masanobu Hanazono, Mito; Shinichi Kazui, Hadano, all of Japan

[73] Assignee: Hitachi, Ltd., Tokyo, Japan

[21] Appl. No.: 4,279

[22] Filed: Jan. 6, 1987

Related U.S. Application Data

[63] Continuation of Ser. No. 757,447, Jul. 22, 1985, abandoned.

[30] Foreign Application Priority Data

Jul. 23, 1984 [JP] Japan ................................ 59-152337

[51] Int. Cl.[4] ............................................. B05D 3/06
[52] U.S. Cl. .................................... 427/53.1; 427/282
[58] Field of Search ............................... 427/53.1, 282

[56] References Cited

U.S. PATENT DOCUMENTS

| | | | |
|---|---|---|---|
| 2,956,900 | 10/1960 | Carlson | 427/306 |
| 3,761,305 | 9/1973 | Franz | 427/304 |
| 4,042,006 | 8/1977 | Engl et al. | 427/43.1 |
| 4,239,789 | 12/1980 | Blum | 427/53.1 |
| 4,259,367 | 3/1981 | Dougherty | 427/96 |
| 4,349,583 | 9/1982 | Kulynych | 427/53.1 |
| 4,511,595 | 4/1985 | Inoue | 427/53.1 |

Primary Examiner—John H. Newsome
Attorney, Agent, or Firm—Antonelli, Terry & Wands

[57] ABSTRACT

A selective working method in which the surface to be worked of a workpiece is locally irradiated with energy beams and an electroless plating solution or an electroless etching solution is contacted with the irradiated workpiece surface, with the electroless plating solution or the electroless etching solution flowing continuously in the substantially same direction of as the direction of an irradiation of energy beams. The electroless plating of the electroless etching can be conducted selectively by this method. Above selective working method is best suited for the formation or correction (repair, filling up etc.) of micro-patterns on the workpiece such as metals, semi-conductors, insulators, etc.

24 Claims, 3 Drawing Sheets

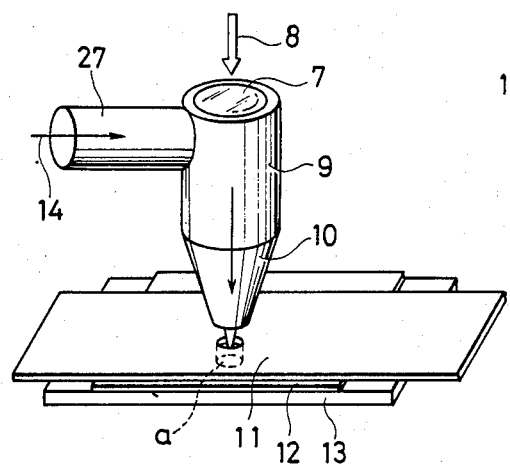
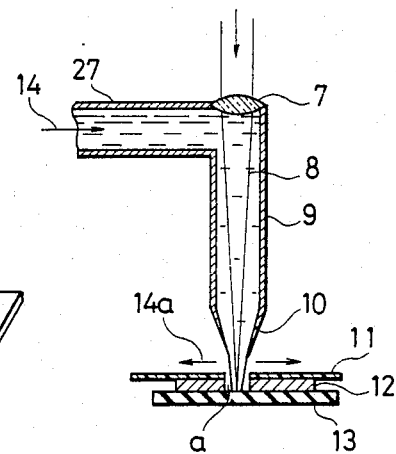
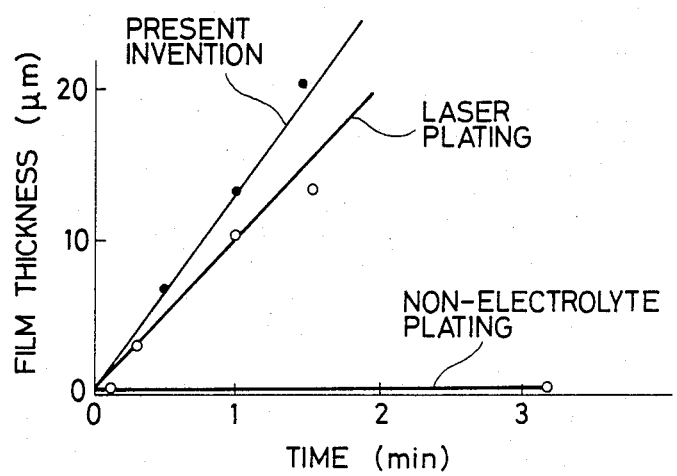

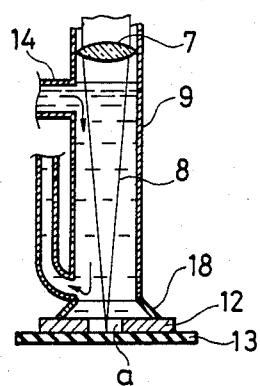
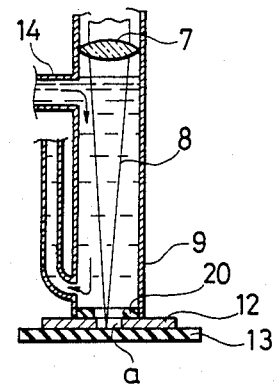
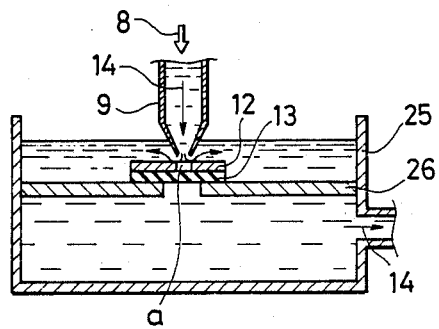

SELECTIVE WORKING METHOD

This application is a continuing application of application Ser. No. 757,447, filed July 22, 1985, now abandoned.

BACKGROUND OF THE INVENTION

1. Field of the Invention

This invention relates to a method for selective plating or etching on workpieces such as metals, semiconductors, insulators, etc. More particularly, the present invention relates to a selective plating or etching method which is best suited for the formation or correction of micro-patterns.

2. Description of the Prior Art

A selective plating method is known in which the workpiece is placed in an electroless plating solution and irradiated with energy beams to promote plating so that the irradiated portion alone is plated. Such method is for instance disclosed in U.S. Pat. No. 4,239,789. This prior art is described below.

U.S. Pat. No. 4,239,789 shows an example of nickel plating in which the workpiece having a nickel film deposited on the surface of a glass substrate is immersed in an electroless plating solution and energy beams are applied thereto to effect nickel plating on the nickel film.

In this example, energy beams, typically laser beams, emitted from an energy source are condensed through a lens system and then applied to the surface of the workpiece in the electroless plating solution. It is disclosed that nickel plating proceeds faster on the portion of the workpiece irradiated with laser beams than on other non-irradiated portion.

In this method, however, the workpiece must be immersed in its entirety in the plating solution to perform partial plating, so that when the workpiece is large, large equipment, especially a large-capacity plating cell, is required. Also, in correction or repair of a micro-pattern by plating according to this method, the portion where no correction is needed is also immersed in the plating solution, so that there is a possibility that such portion too, might be plated or corroded in the plating solution thereby reducing the quality of the product.

SUMMARY OF THE INVENTION

An object of this invention is to provide a selective working method which enables selective plating or etching on a specified portion alone of the surface of a workpiece.

Another object of this invention is to provide a selective working method according to which a specified portion of the workpiece surface can be plated or etched at a markedly faster rate than other portions.

The present invention provides a selective working method which comprises irradiating a portion of the surface of a workpiece to be worked with energy beams, and to bring the irradiated portion in contact with an electroless plating solution or etching solution which continuously flows in the same direction or substantially the same direction as the direction of irradiation of energy beams.

The present invention is based on the finding of the fact that when the portion of the workpiece surface irradiated with energy beams contacts an electroless plating solution or etching solution while allowing said solution to keep on flowing in the same direction or substantially the same direction as the direction of irradiation of energy beams, plating or etching can proceed much faster than when the plating or etching solution is not allowed to flow.

Another method for implementing the present invention comprises setting a workpiece in an electroless plating solution or etching solution, and applying energy beams from an energy source, which have been condensed through a lens system, to the portion to be worked on the workpiece surface while supplying a separately prepared electroless plating solution or etching solution to the workpiece portion to be worked from the same direction in which energy beams are applied. By supplying a separately prepared electroless plating solution or etching solution to the work portion from the direction of the energy beam irradiation, there is produced around the energy beams a flow of electroless plating solution or etching solution directed to the work portion, allowing the electroless plating solution or etching solution to flow continuously only in the limited area of the work portion and its neighborhood. Instead of separately preparing a plating or etching solution, the solution near the surface to be worked of the workpiece may be forcibly caused to flow.

In still another method for carrying out the present invention, an electroless plating solution or etching solution is contacted with only the portion of the workpiece surface irradiated with energy beams. In this case, a solution guide passage for supplying the electroless plating solution or etching solution to the work portion alone is needed. It is also desirable to provide means for preventing the supplied electroless plating solution or etching solution from flowing even to the portion where no working is needed.

BRIEF DESCRIPTION OF THE DRAWINGS

FIG. 1 is a general perspective view of an apparatus for practising the first embodiment of working method in accordance with this invention.

FIG. 2 is a sectional view of FIG. 1.

FIG. 3 is a graph showing the change of the film (deposit) thickness in accordance with time in the first embodiment.

FIG. 7 is a sectional view showing the third embodiment of the invention.

FIG. 8 is a sectional view showing the fourth embodiment.

FIG. 9 is a sectional view showing the fifth embodiment of the invention.

DETAILED DESCRIPTION OF THE PREFERRED EMBODIMENT

Figure 4:
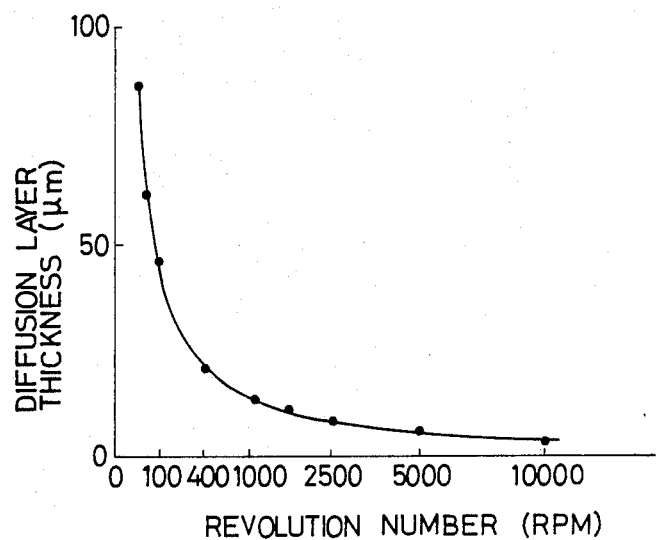
FIG. 4 is a graph showing the change of the thickness of the diffusion layer.

The selective working method in accordance with this invention will be described below by way of the preferred embodiments thereof with reference to the accompanying drawings.

FIG. 1 and FIG. 2 illustrate the first embodiment of the present invention. This first embodiment is an example of application of the invention for correcting repair, (filling up) a defective part such as a break in a wiring pattern or such by using a plating solution cell as described below.

As illustrated in FIG. 1, there exists a defective part (break) a in a metallic pattern 12 formed on a polyimide substrate 13. For correcting such defective part a, first a plating solution cell 9 is set so that its end nozzle 10 is pointed to said defective part a. On said metallic pattern 12 is placed a protective pad 11 designed to expose only the defective part a and its neighborhood. Plating solution cell 9 is cylindrical and provided at its top end with a condensing lens 7. At an upper side of the cell 9 is provided a plating solution feed port 27.

As an electroless copper plating solution 14 is supplied from its feed port 27, the plating solution 14 is ejected from end nozzle 10 of cell 9 toward the defective part a at a predetermined rate (for example, at 60 m/min) as illustrated in FIG. 2. During this operation, the portion of the metallic pattern other than the defective part a and its surrounding area is kept away from exposure to plating solution 14 as said portion is covered by pad 11, so that the quality of the workpiece is not affected by the plating solution. The ejected plating solution 14 is caused to flow on pad 11 as indicated by arrow marks 14a and discharged out. On the other hand, laser beams 8 applied from above said plating solution cell 9 are passed through condensing lens 7 to form a microspot on the defective part a to selectively heat this defective part a alone.

Thus, by selectively heating the defective part a alone with laser beams while allowing the plating solution 14 to flow on and around the defective part a, it becomes possible to carry out high-speed and local plating on the defective part a alone.

The reasons why heating with laser beams and flowing feed of plating solution 14 accelerate plating are here discussed. Since it is generally known that acceleration of plating by heating is due to the increased reaction rate caused by the rise in temperature, here the phenomenon pertaining to the flowing movement of plating solution is considered.

The graph of FIG. 3 shows the change of film (deposit) thickness in accordance with time when a polyimide substrate was set in an electroless copper plating solution (90° C.) with no laser irradiation, and the change of film thickness of the portion irradiated with argon laser when a polyimide substrate was placed in the electroless copper plating solution (20° C.) and partly exposed to argon laser (irradiation density: 600 W/mm²).

In the latter case, it was ascertained independently that the temperature of the argon laser irradiated portion was close to 90° C. It can be seen from the graph that the film forming rate, 600 μm/hr, in the case of laser irradiation is about 100 times the film forming rate, 6 μm/hr, in the case of ordinary electroless plating at the same temperature. This result indicates that the increase of film forming rate by laser irradiation does not solely depend on the temperature rise (90° C.) of the irradiated portion. Another conceivable factor in such acceleration is the encourged mass transport at and around the irradiated portion alone, that is, promoted transport of plating ions to the workpiece surface. In other words, as a result of occurrence of a local solution stirring phenomenon by local heating of the laser irradiated portion, the diffusion layer (the portion near the workpiece where plating ions are consumed to form a concentration gradient of ions) is locally reduced in thickness to facilitate the process whereby the plating ions reach the workpiece surface.

It is well known that generally the more the solution near the substrate is stirred, the more the thickness of the diffusion layer is reduced. The solution can be stirred by, for instance, turning the substrate itself at high speed. The relation between angular speed of rotation $\omega$ of the substrate and thickness $\delta$ of diffusion layer is given by the following equation:

$$\delta = 1.61 D^{\frac{1}{3}} \omega^{-\frac{1}{2}} \nu^{\frac{1}{6}} \qquad (1)$$

wherein D is diffusion constant, and $\nu$ is kinetic viscosity. FIG. 4 is a graphic representation of the relation between thickness $\delta$ of diffusion layer and speed of rotation where D and $\nu$ are given. It can be determined from the graph that the thickness of the diffusion layer is reduced proportionally to the rotational frequency.

In the case of plating, the relation between film forming rate v and speed of rotation $\omega$ of the substrate is given by the following equation:

$$v = ki = \pm 0.62\, kn\, FCD^{\frac{2}{3}} \nu^{-\frac{1}{6}} \omega^{\frac{1}{2}} \qquad (2)$$

wherein i is limiting current density, k is a constant, n is electrovalence, F is the Faraday constant, and C is the concentration of the solution.

When the film forming rate of 600 μm/hr in the case of laser irradiation mentioned above is given for v in the equation (2) to determine the rotational frequency and this value is introduced into the equation (1) and converted to thickness of the diffusion layer, then $\delta$ is given as 0.2 μm. The thickness of diffusion layer when the substrate is turned at 1,000 r.p.m. in an ordinary electroless plating solution is given from FIG. 4 as $\delta = 14$ μm. It can be assumed therefrom that the thickness of the diffusion layer is reduced to 1/70 in the laser irradiated portion alone.

The above results teach that the plating rate increases as the thickness of the diffusion layer decreases.

In this example, plating solution 14 is kept flowing and is stirred at the work portion as illustrated in FIG. 2. Thus, the temperature rise and the stirring effect by laser irradiation and the stirring effect by solution flow combine to produce a synergistic effect to elevate the film forming rate to 2,000 μm/hr, enabling the selective high-efficiency plating on the work portion alone. As described above, owing to continuous flow of the plating solution at the portion of the workpiece to be worked in this example, the diffusion layer is reduced in thickness to accelerate the plating speed.

Figure 5:
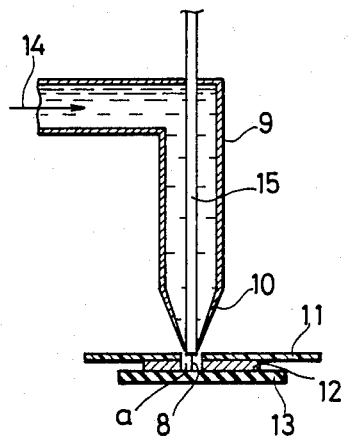
FIG. 5 is a sectional view showing the second embodiment of the invention.
Figure 6:
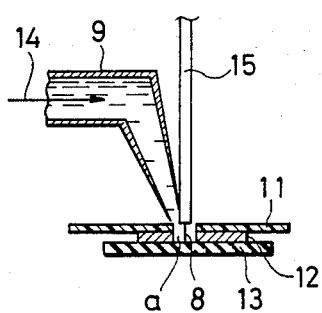
FIG. 6 is a sectional view showing a modification of the second embodiment.

Referring now to FIG. 5 and FIG. 6, there is shown the second embodiment of the invention. In this embodiment, as illustrated in FIG. 5, optical fiber 15 is passed through the inside of plating solution cell 9 to thereby conduct laser beams 8 directly to the defective part a. Other mechanism is the same as the first embodiment and therefore not explained here. Use of optical fiber 15 allows laser beams 8 not to pass through plating solution 14, so that this embodiment is suited when using laser beams of certain wave lengths which are apt to be absorbed in plating solution 14.

Further, optical fiber 15, because of its large degree of freedom for its transfer, is easy to transfer on to polyimide substrate 13. Also, if the plating solution cell 9 incorporated with such optical fiber 15 is remodeled into a small-sized laser pen-like structure, an even more simplified working apparatus can be provided.

Optical fiber 15 may not necessarily be passed through plating solution 14. In the design illustrated in FIG. 6, laser beams 8 are supplied through optical fiber 15 while plating solution 14 is supplied aslant crosswise to the laser beam irradiated portion. For supply of laser beams, the beams coming from a laser source may be used or may be supplied by using optical fiber as in the second embodiment.

According to the second embodiment described above, as the plating solution flows continuously on the work portion of the workpiece, the plating speed is increased and also the supply of laser beams 8 can be conducted efficiently.

FIG. 7 illustrates the third embodiment of the present invention. This embodiment incorporates a suction board 18 attached to the bottom end of plating solution cell 9 as illustrated in FIG. 7. Laser beams are condensed by condensing lens 7, then passed through plating solution 14 and applied to the defective part a. On polyimide substrate 13, only the part where selective plating is needed and its surrounding area are placed in coverage of said suction board 18, so that the portion other than the part and its neighborhood is not contacted with plating solution 14 and therefore no plating is made on the background. In this embodiment, since the plating solution circulates in the cell as indicated by arrow marks, the plating solution keeps on flowing on the work portion of the workpiece, and thus the plating speed is further increased.

The fourth embodiment of the present invention is illustrated in FIG. 8, in which an O-ring 20 is provided at the bottom end of plating solution cell 9. Laser beams 8 are condensed by condensing lens 7, passed through plating solution 14 and applied to the defective part a. On polyimide substrate 13, the area other than the part to be plated and its vicinity is positioned outside of the O-ring 20. The plating solution circulates in the cell as indicated by the arrows, so that it continues to flow on the work portion of the workpiece, allowing high-speed plating.

FIG. 9 illustrates the fifth embodiment of this invention. Polyimide substrate 13 is fixed in position by a fixing jig 26 set on container 25. Since the plating solution 14 circulates in the cell as indicated by the arrows it flows on the work portion of the workpiece; hence, the plating speed is further increased.

Electroless copper plating was conducted on a polyimide substrate according to the embodiment of the present invention illustrated in FIG. 9. The plating solution temperature was 20° C., and argon laser was applied as energy beams at an irradiation density of 600 w/mm². The linear velocity of plating solution supplied into cell 9 was 60 m/min, and the cell end nozzle diameter was 3 mm.

As the result disclosed, the relation between copper plating deposit (film) thickness and plating time was as indicated by Example in FIG. 3, which shows about 1.2 times increase of plating speed over the case where the plating solution was kept stationary.

When electroless copper plating was carried out according to the embodiment illustrated in FIGS. 1 and 2, the relation between plating speed and time was substantially the same as in the case of the above-described embodiment. The plating conditions were the same as in the above-described embodiment. In this embodiment, since the plating solution is supplied into cell 9 alone, the portion of workpiece not to be plated does not come in contact with the plating solution; hence, it is safe from corrosion by the solution. It is preferred to supply the plating solution at a linear velocity of 5-100 m/min, especially 40-70 m/min. If the linear velocity is less than 5 m/min, no satisfactory plating speed increasing effect is provided, while if the linear velocity exceeds 100 m/min, the deposit quality is adversely affected.

The hereinabove described embodiments pertain to selective plating, but as readily understood, if the plating solution is replaced by an etching solution, selective etching can be done at a similarly increased speed and efficiency.

Also, in the embodiments described, laser beams were used as energy beams serving as selective energy source, but an infrared lamp, xenon lamp and the like can likewise be used.

In any of the embodiments shown above, laser beams are applied onto a polyimide substrate having a defective (break) part a to correct the pattern, but if laser beams are subjected to sweeping in conformity to a desired pattern, pattern forming without masking becomes possible.

Also, the above embodiments were shown as applied to a plating treatment, but it is also possible in accordance with this invention to perform selective elimination of the unnecessary pattern by using an etching solution. In the latter case, it is simply required to reverse the reaction as:

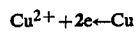

The following may be cited as typical examples of composition of etching solution usable in this invention:

| | |
|---|---|
| Water | 1 liter |
| Hydrochloric acid | 300 ml |
| Nitric acid | 300 ml |
| And | |
| Water | 1 liter |
| Potassium hydroxide (KOH) | 40 g |

As for the structure of etching solution cell, the way of supply of laser beams and other matters, they may be identical with those used in the embodiments shown above.

As described above, in accordance with this invention in which the plating or etching solution is kept flowing on the work portion of a workpiece, it is possible to greatly increase the working rate as compared with the conventional procedures where the radiant energy beams are applied singly.

What is claimed is:
1. A method for selectively electrolessly plating or etching a surface of a workpiece having a defective portion thereon, comprising the steps of:
locally circulating a continuously flowing electroless solution, being selected from one of a plating solution and an etching solution, to the defective portion of the workpiece and an immediately surrounding area thereof, whereby another area of the workpiece does not have the electroless solution circulated thereto, so that only the defective portion and the immediately surrounding area thereof, or the workpiece, is supplied with electroless solution, wherein during the locally circulating step an electroless solution cell is positioned above the workpiece, so as to locally supply the continuously flowing electroless solution to the defective portion of the workpiece and the immediately surrounding area thereof, and a pad is directly positioned on the surface of the workpiece so as to expose only the defective portion of the workpiece and the immediately surrounding area thereof, the pad and electroless solution cell, in combination, confining the continuously flowing electroless solution, in its exposure to the workpiece, to the defective portion and the immediately surrounding area thereof; and locally irradiating an energy beam onto the defective portion of the workpiece to heat the defective portion.

2. A method for selectively electrolessly plating or etching a surface of a workpiece according to claim 1, wherein said energy beam is a laser beam.

3. A method for selectively electrolessly plating or etching a surface of a workpiece according to claim 1, wherein said energy beam is supplied through the flow of said electroless solution.

4. A method for selectively electrolessly plating or etching a surface of a workpiece according to claim 1, wherein said energy beam is applied toward the workpiece without being contacted with the flow of said electroless solution.

5. A method for selectively electrolessly plating or etching a surface of a workpiece according to claim 2, wherein said laser beam is conducted by an optical fiber to the defective portion to be worked.

6. A method for selectively electrolessly plating or etching a surface of a workpiece having a defective portion thereon, comprising the steps of:

setting the workpiece in an electroless solution, selected from one of a plating solution and an etching solution, so that only the defective portion and a surrounding area thereof, of the workpiece, are exposed to the electroless solution;

locally circulating a continuous flow of said electroless solution to the defective portion and an immediately surrounding area thereof, whereby another area of the workpiece does not have the electroless solution circulated thereto, so that only the defective portion and the immediately surrounding area thereof, of the workpiece, is in contact with the electroless solution, wherein during the locally circulating step an electroless solution cell is positioned above the workpiece, so as to locally supply the continuously flowing electroless solution to the defective portion of the workpiece and the immediately surrounding area thereof, and a pad is directly positioned on the surface of the workpiece so as to expose only the defective portion of the workpiece and the immediately surrounding area thereof, the pad and electroless solution cell, in combination, confining the continuously flowing electroless solution, in its exposure to the workpiece, to the defective portion and the immediately surrounding area thereof; and locally irradiating an energy beam onto the defective portion of the workpiece, to heat the defective portion of the workpiece, said electroless solution flowing in substantially the same direction as a direction of an irradiation of said energy beam.

7. A method for selectively electrolessly plating or etching a surface of a workpiece according to claim 6, wherein the electroless solution cell is selected from one of a plating solution cell and an etching solution cell, and is provided close to the defective portion to be worked, a separately prepared electroless solution forms a flow on the defective portion to be worked and the immediately surrounding area thereof, and further said separately prepared solution flows in substantially the same direction as the direction of irradiating of said energy beam.

8. A method of selectively electrolessly plating or etching a surface of a workpiece according to claim 1, wherein said electroless solution flows in substantially the same direction as a direction of irradiation of the energy beam.

9. A method of selectively electrolessly plating or etching a surface of a workpiece according to claim 1, wherein the circulating a continuously flowing electroless solution includes directing the solution on a slant against the defective portion.

10. A method of selectively electrolessly plating or etching a surface of a workpiece, comprising the steps of:

locally and selectively directing a flow of electroless solution, selected from the group consisting of electroless plating solution and electroless etching solution, to a selected portion of the workpiece, with only said selected portion of the workpiece and an immediately surrounding area thereof, of the workpiece, being in contact with said electroless solution, whereby another area of the workpiece does not have the electroless solution locally and selectively directed thereto, so as to electrolessly plate or electrolessly etch, respectively, said selected portion of the workpiece, wherein during the local and selective directing step an electroless solution cell is positioned above the workpiece, so as to locally supply the flowing electroless solution to the selected portion of the workpiece and the immediately surrounding area thereof, and a pad is directly positioned on the surface of the workpiece so as to expose only the selected portion of the workpiece and the immediately surrounding area thereof, the pad and electroless solution cell, in combination, confining the flowing electroless solution, in its exposure to the workpiece, to the selected portion and the immediately surrounding area thereof; and locally irradiating an energy beam onto said selected portion of the workpiece to heat the selected portion of the workpiece.

11. A method for selectively electrolessly plating or etching a workpiece according to claim 10, wherein the locally irradiating is performed in a predetermined direction, and the locally and selectively directing of the flow of electroless solution is performed in said predetermined direction.

12. A method for selectively electrolessly plating or etching a workpiece according to claim 10, wherein the energy beam is a laser beam.

13. A method for selectively electrolessly plating or etching a workpiece according to claim 10, wherein the electroless solution cell has an inlet and outlet for electroless solution, and an opening; and prior to the irradiating and the directing a flow of electroless solution, the electroless solution cell is positioned so that the opening is over said selected portion of the workpiece, and electroless solution is passed through the cell from the inlet to the outlet so as to provide the local and selective directing of the flow of electroless solution.

14. A method for selectively electrolessly plating or etching a workpiece according to claim 13, wherein said opening is positioned over only said selected portion of the workpiece and the immediately surrounding area thereof.

15. A method for selectively electrolessly plating or etching a workpiece according to claim 10, wherein a continuous flow of electroless solution is locally selectively directed to said selected portion of the workpiece.

16. A method for selectively electrolessly plating or etching a surface of a workpiece having a defective portion thereon, comprising the steps of:
locally circulating a continuously flowing electroless solution, being selected from one of a plating solution and an etching solution, so as to cause the defective portion of the workpiece and an immediately surrounding area thereof to be in contact with a fresh electroless solution, whereby another area of the workpiece does not have the electroless solution in contact therewith, so that only the defective portion and the immediately surrounding area thereof, of the workpiece, is in contact with electroless solution, wherein during the locally circulating step an electroless solution cell is positioned above the workpiece, so as to locally supply the continuously flowing electroless solution to the defective portion of the workpiece and the immediately surrounding area thereof, and a pad is directly positioned on the surface of the workpiece so as to expose only the defective portion of the workpiece and the immediately surrounding area thereof, the pad and electroless solution cell, in combination, confining the continuously flowing electroless solution, in its exposure to the workpiece, to the defective portion and the immediately surrounding area thereof; and
locally irradiating an energy beam onto the defective portion of the workpiece to heat the defective portion of the workpiece.

17. A method for selectively electrolessly plating or etching a surface of a substrate to form a micro-pattern on the surface of the workpiece, comprising the steps of:
locally continuously circulating an electroless solution, being selected from one of a plating solution and an etching solution, so as to cause the surface of the substrate to be in contact with said electroless solution, with only a portion of the surface of the substrate being exposed to the electroless solution, wherein during the locally continuously circulating step an electroless solution cell is positioned above the substrate, so as to locally supply the electroless solution to the portion of the surface exposed to the electroless solution, and a pad is directly positioned on the surface of the substrate so as to expose said portion of the surface exposed to the electroless solution, the pad and electroless solution cell, in combination, confining the electroless solution, in its exposure to the substrate, to said portion of the surface; and
locally irradiating an energy beam onto the surface of the substrate to heat the surface of the workpiece; so as to form a micro-pattern on the surface of the substrate.

18. A method for selectively electrolessly plating or etching a surface of a substrate according to claim 17, wherein the energy beam is locally irradiated onto said portion of the surface of the substrate to heat said portion of the surface of the substrate, and said micro-pattern is formed on said portion of the surface of the substrate.

19. A method for selectively electrolessly plating or etching a surface of a workpiece having a defective portion thereon, comprising the steps of:
locally circulating a continuously flowing electroless solution, being selected from one of a plating solution and an etching solution, to the defective portion of the workpiece and a surrounding area thereof, with only the defective portion and a surrounding area thereof, of the workpiece, being supplied with electroless solution, wherein during the locally circulating step a cell is positioned directly on the workpiece so as to locally supply the continuously flowing electroless solution to the portion of the workpiece and the surrounding area thereof; and
locally irradiating an energy beam onto the defective portion of the workpiece to heat the defective portion.

20. A method for selectively electrolessly plating or etching a surface of a workpiece according to claim 19, wherein the defective portion of the workpiece and immediately surrounding area thereof are caused to be in contact with a fresh electroless solution.

21. A method for selectively electrolessly plating or etching a surface of a workpiece having a defective portion thereon, comprising the steps of:
setting the workpiece in an electroless solution, selected from one of a plating solution and an etching solution, so that only the defective portion and a surrounding area thereof, of the workpiece, are exposed to the electroless solution;
locally circulating a continuous flow of said electroless solution to the defective portion and a surrounding area thereof, with only the defective portion and a surrounding area thereof, of the workpiece, being in contact with the electroless solution, wherein during the locally circulating step a cell is positioned directly on the workpiece so as to locally supply the continuously flowing electroless solution to the portion of the workpiece and the surrounding area thereof; and
locally irradiating an energy beam onto the defective portion of the workpiece, to heat the defective portion of the workpiece,
said electroless solution flowing in substantially the same direction as a direction of an irradiation of said energy beam.

22. A method for selectively electrolessly plating or etching a surface of a workpiece according to claim 21, wherein the defective portion of the workpiece and immediately surrounding area thereof are caused to be in contact with a fresh electroless solution.

23. A method of selectively electrolessly plating or etching a surface of a workpiece, comprising the steps of:
locally and selectively directing a flow of electroless solution, selected from the group consisting of electroless plating solution and electroless etching solution, to a selected portion of the workpiece, with only said selected portion of the workpiece and a surrounding area thereof, of the workpiece, being in contact with said electroless solution, so as to electrolessly plate or electrolessly etch, respectively, said selected portion of the workpiece, wherein during the locally circulating step a cell is positioned directly on the workpiece so as to locally supply the continuously flowing electroless solution to the portion of the workpiece and the surrounding area thereof; and locally irradiating an energy beam onto said selected portion of the workpiece to heat the selected portion of the workpiece.

24. A method for selectively electrolessly plating or etching a surface of a workpiece according to claim 23, wherein the selected portion of the workpiece and immediately surrounding area thereof are caused to be in contact with a fresh electroless solution.

* * * * *